(12) United States Patent
Sudo

(10) Patent No.: US 11,417,403 B2
(45) Date of Patent: *Aug. 16, 2022

(54) SEMICONDUCTOR DEVICE

(71) Applicant: Winbond Electronics Corp., Taichung (TW)

(72) Inventor: Naoaki Sudo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/148,591

(22) Filed: Jan. 14, 2021

(65) Prior Publication Data
US 2021/0257032 A1 Aug. 19, 2021

(30) Foreign Application Priority Data

Feb. 18, 2020 (JP) ............................. JP2020-024853

(51) Int. Cl.
*G11C 16/30* (2006.01)
(52) U.S. Cl.
CPC .................... *G11C 16/30* (2013.01)
(58) Field of Classification Search
CPC ......... G11C 16/30; G11C 5/148; G11C 5/143; G11C 16/32; G11C 16/0408; G11C 16/10
See application file for complete search history.

(56) References Cited

U.S. PATENT DOCUMENTS

| | | |
|---|---|---|
| 4,570,242 A | 2/1986 | Nagami |
| 9,202,530 B2 * | 12/2015 | Jang .................. G11C 5/147 |
| 10,339,995 B2 | 7/2019 | Do et al. |
| 10,445,011 B2 | 10/2019 | Chen |
| 2011/0185208 A1 | 7/2011 | Iwamoto et al. |
| 2018/0150252 A1 | 5/2018 | Lewis et al. |
| 2018/0203643 A1 | 7/2018 | Pedersen |

(Continued)

FOREIGN PATENT DOCUMENTS

| CN | 109901694 | 6/2019 |
|---|---|---|
| JP | S5873096 | 5/1983 |

(Continued)

OTHER PUBLICATIONS

Office Action of Taiwan Counterpart Application, dated Jun. 21, 2021, pp. 1-4.

(Continued)

*Primary Examiner* — Jay W. Radke
(74) *Attorney, Agent, or Firm* — JCIPRNET

(57) ABSTRACT

A semiconductor device capable of automatically transitioning from a standby mode to a deep power down (DPD) mode is provided. The semiconductor device includes: internal circuits capable of operating in response to an input signal from an input/output circuit; and a controller capable of controlling operations of the internal circuits. The internal circuit supporting the DPD mode includes: a measurement part, measuring a time since a time point of the semiconductor device entering the standby mode; a transition time detection part, detecting a case where a measurement time of the measurement part has reached a certain time; and a DPD signal generation part, generating a power down enable signal for further reducing power consumption in the standby mode when a transition time is detected.

10 Claims, 6 Drawing Sheets

(56) References Cited

U.S. PATENT DOCUMENTS

2021/0157389 A1* 5/2021 Intrater ................. G11C 11/409
2021/0257997 A1* 8/2021 Sudo ...................... G11C 16/30

FOREIGN PATENT DOCUMENTS

| | | |
|---|---:|---:|
| JP | S6159686 | 3/1986 |
| JP | H11191289 | 7/1999 |
| JP | 2002083494 | 3/2002 |
| JP | 2003059260 | 2/2003 |
| JP | 2006228361 | 8/2006 |
| JP | 2006252748 | 9/2006 |
| TW | 201604684 | 2/2016 |
| TW | I582580 | 5/2017 |
| TW | I672704 | 9/2019 |
| WO | 2016204851 | 12/2016 |
| WO | 2017034852 | 3/2017 |

OTHER PUBLICATIONS

Office Action of Japan Counterpart Application, dated Mar. 3, 2021, pp. 1-5.

\* cited by examiner

SEMICONDUCTOR DEVICE

CROSS-REFERENCE TO RELATED APPLICATION

This application claims the priority benefit of Japan application serial no. 2020-024853, filed on Feb. 18, 2020. The entirety of the above-mentioned patent application is hereby incorporated by reference herein and made a part of this specification.

BACKGROUND

Technical Field

The disclosure relates to a semiconductor device such as a flash memory, and in particular to operation in a standby mode or a deep power down mode.

Description of Related Art

The NAND type flash memory may be read or programmed in units of pages, and may be erased in units of blocks. For example, the flash memory shown in the patent document (Japanese Laid-open No. 2006-252748) discloses the following technology: in the standby mode and the normal operating mode, different power supply voltages are supplied to the page buffer/sensing circuit, so as to reduce the power consumption in the standby mode.

In the flash memory, there are the active mode for reading, programming, erasing, etc. in response to a command from the user, and the standby mode for accepting the command from the user. In the standby mode, the operation of the internal circuit is restricted, so that the power consumption reaches below a certain level, but when a command is input from the user, the command must be immediately responded to. Therefore, even in the standby mode, off leak current is still generated in a volatile circuit such as a logic circuit or a register. The off leak current will increase as the element size shrinks. In addition, when the internal power supply voltage is used, the internal power supply voltage detection circuit must be operated, thereby consuming a certain degree of power. That is, it is difficult to reduce the current consumption in the standby mode.

In order to further reduce the power consumption in the standby mode, depending on the flash memory, a deep power down (hereinafter referred to as DPD) mode may be equipped. In the DPD mode, the internal power supply to a portion of the internal circuit used in the standby mode is cut off, so as to reduce the off leak current. In the DPD mode, for example, a DPD start command is used to enter the mode, and a DPD dismiss command is used to recover from the mode. The DPD mode requires a certain amount of time for the cut off circuit to operate normally, but has the merit of drastically reducing the power consumption.

FIG. 1 shows an example of operating waveforms when a NAND type flash memory equipped with a serial peripheral interface (SPI) function transitions to the DPD mode. When in the standby mode, the flash memory is selected through setting a chip select signal /CS to a low level. During this period, a DPDDPD command (89h) is input from a data registration terminal DI in synchronization with a clock signal. The flash memory transitions to the DPD mode at a time $T_{DPD}$ after a certain period tDP has elapsed since the input of the DPD command to block the internal voltage supply to a specific internal circuit. During a period before the time $T_{DPD}$, the current in the standby mode is consumed. During a period after the time $T_{DPD}$, the current in the DPD mode is consumed.

FIG. 2 shows an example of an internal voltage generation circuit for standby supporting the DPD mode of a conventional flash memory. An internal voltage generation circuit 10 includes a p-channel metal oxide semiconductor (PMOS) transistor P1 and a PMOS transistor P2 connected in series between an external power supply voltage VCC (for example, 3.3 V) and the ground (GND) potential, a resistance ladder LAD, and a comparator CMP that compares a voltage Va divided by resistance of the resistance ladder LAD with a reference voltage VREF. A DPD enable signal DPDEN is applied to the gate of the transistor P1, a comparison result of the comparator CMP is applied to the gate of the transistor P2, and a voltage supply node INTVDD is connected between the transistor P2 and the resistance ladder LAD.

In the standby mode, the DPD enable signal DPDEN is at the L level, and the transistor P1 and the transistor P2 are turned on. In order to reduce the current consumed by the resistance ladder LAD, the resistance ladder LAD is set to high resistance. In addition, when the voltage supply node INTVDD outputs a target voltage, a tap position of the voltage Va is selected such that Va=VREF. In addition, the resistance of a general internal voltage generation circuit operating in a non-standby mode is less than the resistance ladder LAD of FIG. 2. At the voltage supply node INTVDD, for example, a 2.4 V voltage is generated.

When the user inputs the DPD command according to the sequence shown in FIG. 1, the controller of the flash memory enables the DPD enable signal DPDEN to be transferred from the L level to the H level within the period tDP since the input of the command, so that the transistor P1 is disconnected to block the external power supply voltage VCC. As a result, the power is not supplied to the circuit connected to the voltage supply node INTVDD, so the power consumption is further reduced compared with the standby mode.

In this way, the conventional flash memory has the following issue: in order to transition from the standby mode to the DPD mode, the user must input the DPD command, and if the flash memory does not support the DPD command, the transition to the DPD mode cannot be performed. Such issue is not limited to the flash memory, and is the same in other semiconductor devices.

SUMMARY

The semiconductor device of the disclosure includes: a semiconductor integrated circuit, capable of operating in response to an external input signal; a measurement part, measuring a time since a time point of the semiconductor device entering the standby mode; a detection part, detecting a case where a measurement time of the measurement part has reached a certain time; and a generation part, generating a power down enable signal for further reducing power consumption in a standby mode when the detection part detects the certain time.

According to the disclosure, it is possible to automatically transition from the standby mode to the power down mode without inputting a command, etc. for transitioning to the power down mode. Therefore, even a semiconductor device that does not support the command, etc. for transitioning to the power down mode can be transitioned to the power down mode.

DETAILED DESCRIPTION OF DISCLOSED EMBODIMENTS

The semiconductor device of the disclosure is not particularly limited, and may be implemented in, for example, a NAND type or NOR type flash memory, a dynamic random access memory (DRAM), a static random access memory (SRAM), a logic, an application specific integrated circuit (ASIC), a digital signal processor (DSP), etc.

Figure 1:
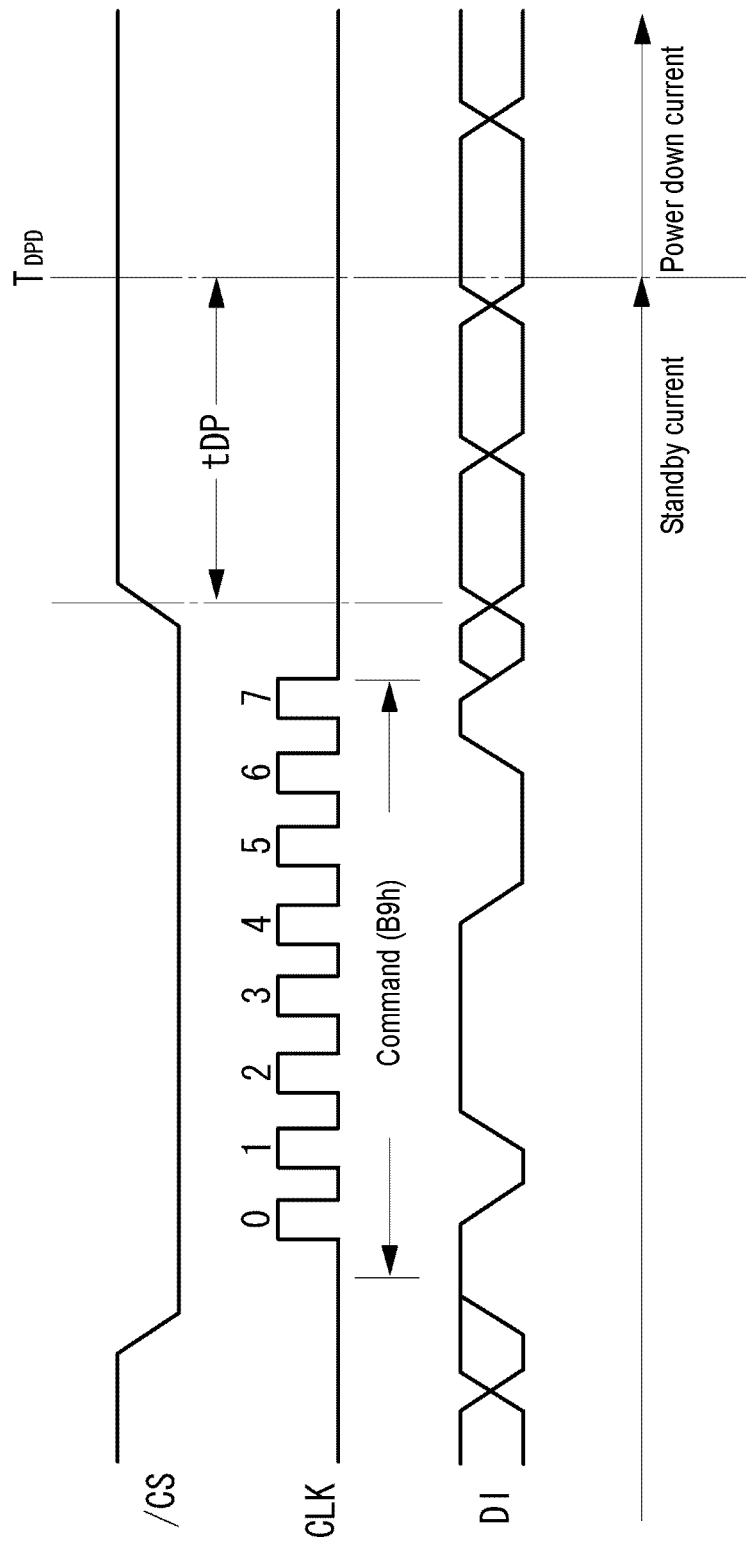
FIG. 1 is a diagram showing an example of operating waveforms when a conventional flash memory transitions to a deep power down (DPD) mode.
Figure 2:
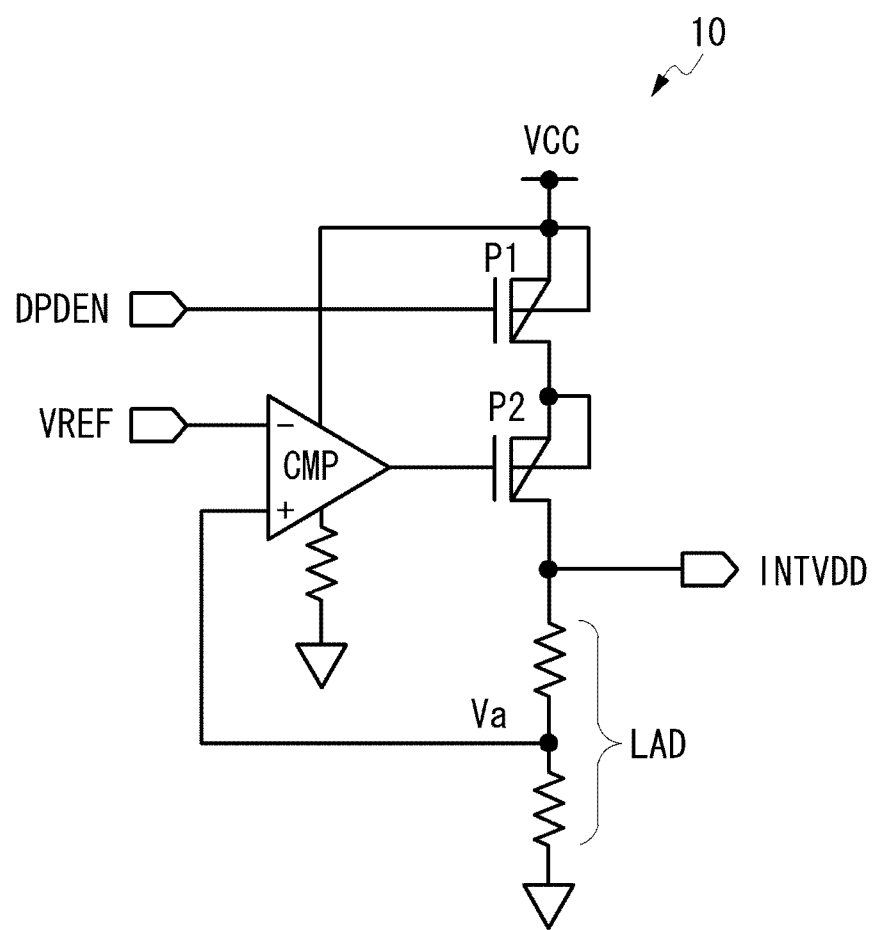
FIG. 2 is a diagram showing an example of an internal voltage generation circuit for standby supporting the DPD mode of the conventional flash memory.
Figure 3A:
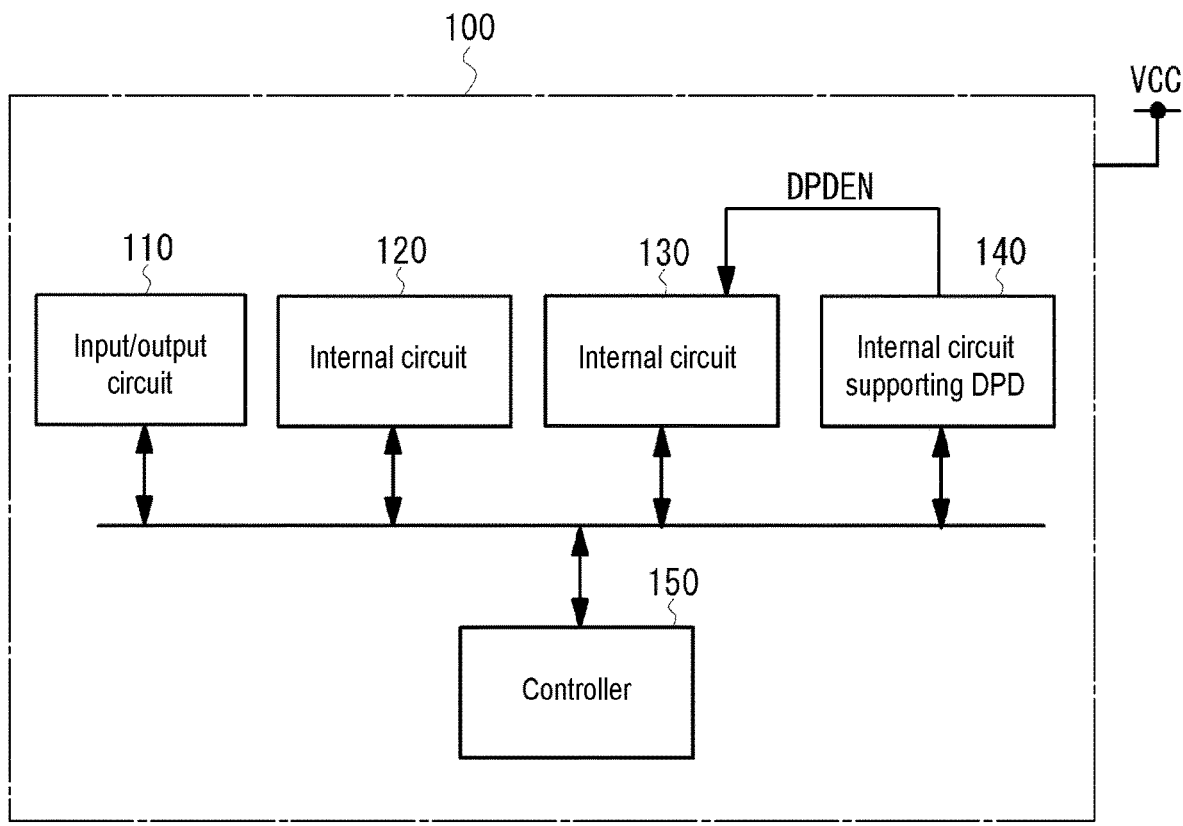
FIG. 3(A) is a diagram showing a schematic configuration of a semiconductor device according to an embodiment of the disclosure.
Figure 3B:
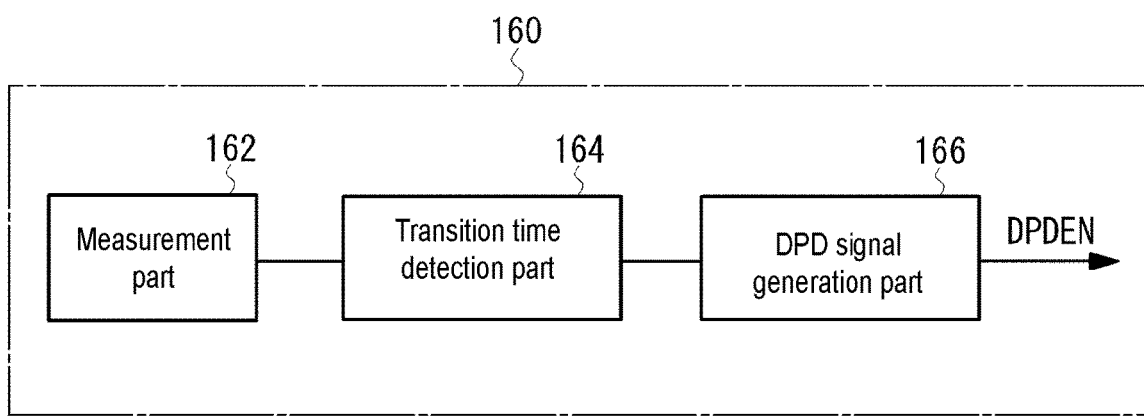
FIG. 3(B) is a diagram showing a functional configuration of a DPD determination part of an internal circuit supporting the DPD mode.

Next, the embodiments of the disclosure will be described in detail with reference to the drawings. FIG. 3(A) and FIG. 3(B) are diagrams showing examples of configurations of a semiconductor device 100 of this embodiment. The semiconductor device 100 includes an input/output circuit 110, an internal circuit 120, an internal circuit 130, an internal circuit 140, and a controller 150. The circuits are integrated circuits integrated on a semiconductor substrate. The controller 150 may receive an external input signal such as a command, a control signal, data, an address, etc. via the input/output circuit 110, and control operations of the internal circuit 120, the internal circuit 130, and the internal circuit 140 based on the received input signal such as a command or a control signal. In addition, data processed by the internal circuit 120, the internal circuit 130, and the internal circuit 140 may be output to the outside via the input/output circuit 110. The content of processing performed by the internal circuit 120, the internal circuit 130, and the internal circuit 140 is arbitrary and is not particularly limited. The controller 150 is constructed using hardware and/or software, and may be, for example, a micro controller, a programmable logic, a state machine, etc.

An external power supply voltage VCC (for example, 3.3 V) is supplied to the semiconductor device 100. The external power supply voltage VCC or an internal voltage VDD generated by the external power supply voltage VCC is supplied to an internal integrated circuit. In an embodiment, the semiconductor device 100 may include multiple power consumption modes. In an active mode, an internal circuit may operate at full specifications without power consumption restrictions. In a standby mode, the power consumption of an internal circuit may be reduced according to determined requirements, and an input signal such as a command may be responded to. The standby mode is determined, for example, when an internal circuit ends the determined operation or in response to an external command or control signal, and such standby mode is predefined in the semiconductor device 100. In the standby mode, for example, a boost circuit (charge pump circuit) is stopped, a clock oscillator is stopped, the internal voltage VDD is intermittently generated, or a complementary metal oxide semiconductor (CMOS) inverter is set to a tristate. In the DPD mode, the power supply to a specific internal circuit may be blocked to further reduce the power consumption in the standby mode.

In a conventional semiconductor device, in order to transition from the standby mode to the DPD mode, the input of an external command is required. In contrast, the semiconductor device 100 of this embodiment does not require the input of a command or a control signal for transitioning from the standby mode to the DPD mode, and can automatically enter the DPD mode. The dismiss of the DPD mode is implemented through, for example, the input of an arbitrary external command or control signal.

As shown in FIG. 3(A), the semiconductor device 100 includes the internal circuit 140 supporting the DPD mode. The internal circuit 140 supporting the DPD mode operates at least in the standby mode. In an embodiment, the internal circuit 140 supporting the DPD mode may also operate in response to an enable signal from the controller 150 when entering the standby mode. In addition, in another embodiment, the internal circuit 140 supporting the DPD mode may also continue to operate throughout the active mode and the standby mode.

The internal circuit 140 supporting the DPD mode of this embodiment has a function of determining whether to transition from the standby mode to the DPD mode. When it is determined to transition to the DPD mode, a DPD enable signal DPDEN for blocking the power supply is generated. In the example of FIG. 3(A) and FIG. 3(B), the DPD enable signal DPDEN generated by the internal circuit 140 supporting the DPD mode is supplied to the internal circuit 130. The internal circuit 130 blocks the power supplied to itself (either the external power supply voltage VCC or the internal voltage VDD) in response to the DPD enable signal DPDEN. As a result, in the DPD mode, the power consumption of the semiconductor device is further reduced as compared with the standby mode. In addition, here, an example of supplying the DPD enable signal DPDEN to the internal circuit 130 is shown, but the DPD enable signal DPDEN may also be supplied to multiple internal circuits.

FIG. 3(B) is a diagram showing a functional configuration of a DPD determination part included in the internal circuit 140 supporting the DPD mode. In order to determine whether to transition from the standby mode to the DPD mode, the DPD determination part 160 includes a measurement part 162, a transition time detection part 164, and a DPD signal generation part 166. The DPD determination part 160 is implemented using hardware and/or software.

The measurement part 162 measures a time since a time point of entering the standby mode. If the internal circuit 140 supporting the DPD mode is activated in the standby mode, the time point of entering the standby mode may be the time when the internal circuit 140 supporting the DPD mode starts to operate. Alternatively, if the internal circuit 140 supporting the DPD mode is notified of the standby mode from the controller 150, the time point of entering the standby mode may be the time determined by a signal representing the standby mode. The measurement part 162 is not specifically limited to this configuration, and may, for example, include a counter that counts a clock signal.

The transition time detection part 164 monitors the time measured by the measurement part 162, and detects the time to transition to the DPD mode. Specifically, when a measurement time is consistent with a predetermined time, it is determined to transition to the DPD mode. In other words, when the predetermined time has elapsed since the standby mode, it is determined to transition to the DPD mode.

When the transition time detection part 164 monitors a transition time to the DPD mode, the DPD signal generation part 166 generates the DPD enable signal DPDEN for blocking the power supply. In the example of FIG. 3(A), the DPD enable signal DPDEN is supplied to the internal circuit 130.

Figure 4:
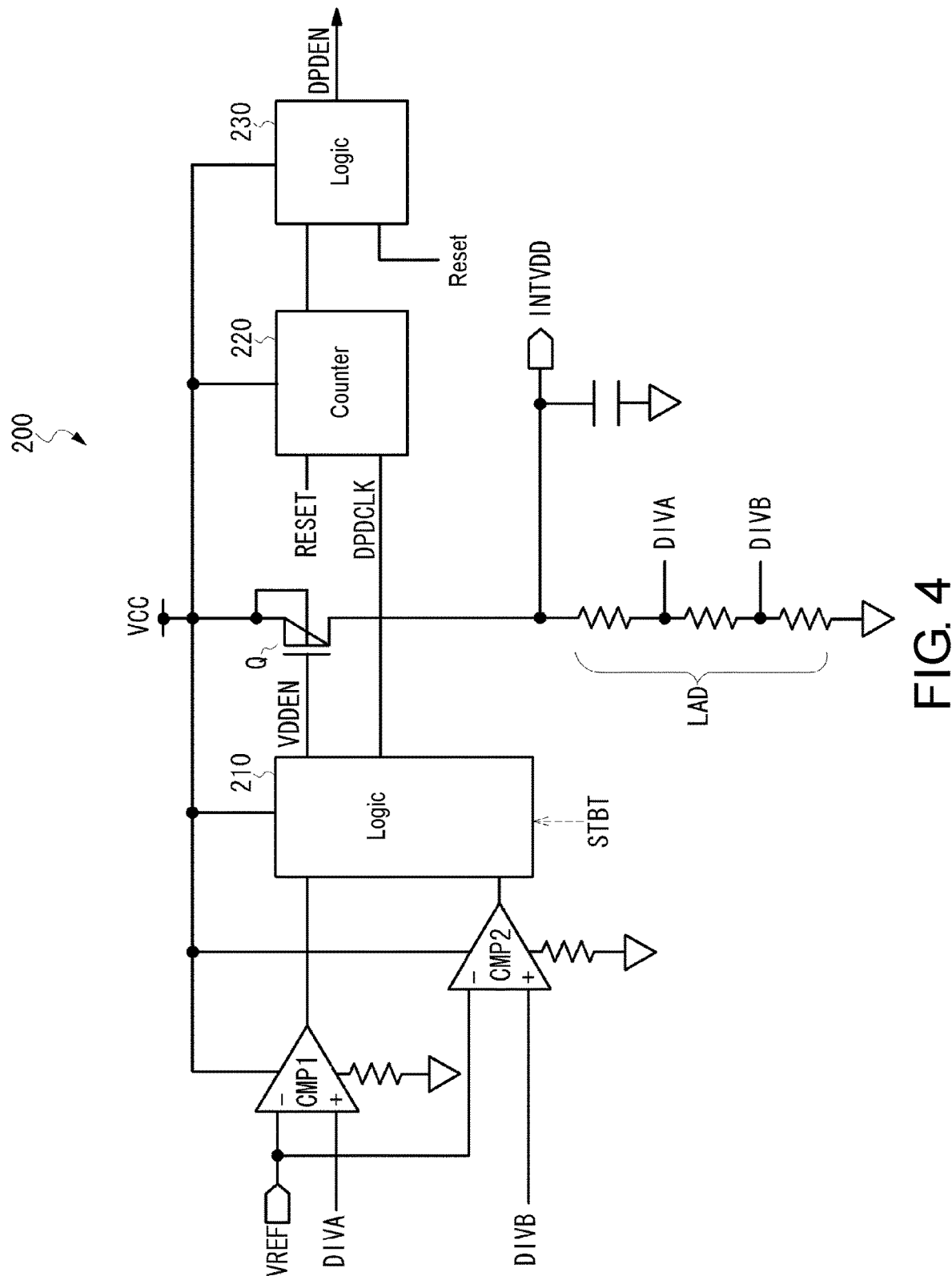
FIG. 4 is a diagram showing a configuration of an internal voltage generation circuit for standby supporting the DPD mode according to an embodiment of the disclosure.

Next, the specific circuit of the internal circuit 140 supporting the DPD mode will be explained. FIG. 4 is a diagram showing a configuration of an internal voltage generation circuit supporting the DPD mode. An internal voltage generation circuit 200 supporting the DPD mode is a circuit that generates the internal voltage VDD (for example, 2.4 V) by the external power supply voltage VCC (for example, 3.3 V). As shown in the drawing, the internal voltage generation circuit 200 includes two comparators CMP1 and CMP2, a logic 210, a p-channel metal oxide semiconductor (PMOS) transistor Q, a resistance ladder LAD, a counter 220, and a logic 230.

In a current path between the external power supply voltage VCC and the ground (GND), the PMOS transistor Q and the resistance ladder LAD including multiple series resistors are connected in series. A switch control signal VDDEN output from the logic 210 is applied to the gate of the transistor Q. When the switch control signal VDDEN is at the L level, the transistor Q is turned on and the power is supplied from the external power supply voltage VCC. A voltage supply node INTVDD is connected between the transistor Q and the resistance ladder LAD. The internal voltage VDD is supplied from the voltage supply node INTVDD. One or more load circuits are connected to the voltage supply node INTVDD.

The resistance ladder LAD is connected between the voltage supply node INTVDD and the GND. If the internal voltage generation circuit 200 operates only in the standby mode, the resistance ladder LAD includes a high-resistance resistor in order to suppress the power consumption in the standby mode. In addition, a first voltage DIVA divided by resistance is generated at a first selected tap position and a second voltage DIVB divided by resistance is generated at a second selected tap position of the resistance ladder LAD. The first voltage DIVA is greater than the second voltage DIVB (DIVA>DIVB).

The comparator CMP1 inputs the reference voltage VREF at a non-inverting input terminal (−), inputs the first voltage DIVA at an inverting input terminal (+), and provides the H or L level output representing the comparison result to the logic 210. The comparator CMP2 inputs the reference voltage VREF at the non-inverting input terminal (−), inputs the second voltage DIVB at the inverting input terminal (+), and provides the H or L level output representing the comparison result to the logic 210.

The logic 210 generates the switch control signal VDDEN based on the comparison results of the comparator CMP1 and the comparator CMP2. In an embodiment, at the time point of entering the standby mode, the logic 210 enables the switch control signal VDDEN to be transferred to the H level, and sets the transistor Q to be not turned on. Through stopping the supply of the external power supply voltage VCC, the voltage of the voltage supply node INTVDD is discharged to the GND via the resistance ladder LAD. At this time, the voltage of the voltage supply node INTVDD changes with the resistor-capacitor (RC) time constant of the resistance of the resistance ladder LAD and the load capacitance connected to the voltage supply node INTVDD. Due to the relationship of the first voltage DIVA>the second voltage DIVB, after the comparison result of the comparator CMP1 is transferred from the H level to the L level, the comparison result of the comparator CMP2 is transferred from the H level to the L level.

When the comparison results of the comparator CMP1 and the comparator CMP2 both become the L level, the logic 210 enables the switch control signal VDDEN to be transferred from the H level to the L level, and sets the transistor Q to be turned on. As a result, when the power is supplied from the external power supply voltage VCC, the first voltage DIVA and the second voltage DIVB rise, the comparison results of the comparator CMP1 and the comparator CMP2 both become the H level, and in response, the logic 210 enables the switch control signal VDDEN to be transferred from the L level to the H level, and sets the transistor Q to be not turned on.

The time until the first voltage DIVA and the second voltage DIVB become less than the reference voltage VREF, that is, the time until the comparison results of the comparator CMP1 and the comparator CMP2 both become the L level is determined according to the RC time constant. If the internal voltage generation circuit 200 operates only in the standby mode, the RC time constant is increased through setting the resistance ladder LAD to high resistance, thereby extending the time until the transistor Q is turned on, and reducing the power consumption when the external power supply voltage VCC is supplied.

The logic 210 then generates a clock signal DPDCLK based on the comparison results of the comparator CMP1 and the comparator CMP2, and provides the clock signal DPDCLK to the counter 220. Specifically, when it is detected that the first voltage DIVA and the second voltage DIVB both become less than the reference voltage VREF, the clock signal DPDCLK with a certain pulse width is generated in response. For example, the clock signal DPDCLK may be a clock signal in synchronization with the switch control signal VDDEN.

The counter 220 counts the clock of the clock signal DPDCLK, and provides a count result to the logic 230. The counter 220 is reset through a reset signal when the DPD mode is dismissed. The logic 230 receives a count value of the counter 220, detects whether the count value has reached a predetermined number of times. When the count value has reached, the DPD enable signal DPDEN for blocking the power supply is generated. In addition, when the DPD mode is dismissed, the logic 230 sets the DPD enable signal DPDEN to be disabled in response to the reset signal.

Figure 5:
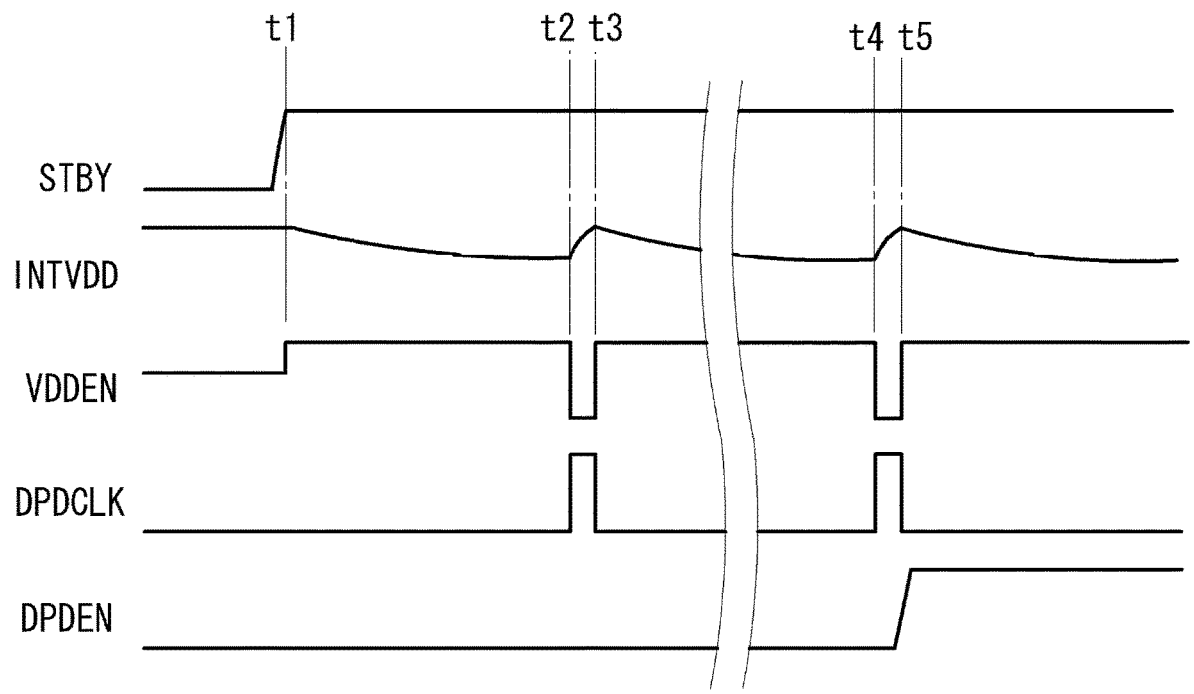
FIG. 5 is a diagram showing operating waveforms of each part of the internal voltage generation circuit shown in FIG. 4.

Next, operating waveforms of the internal voltage generation circuit 200 are shown in FIG. 5 to illustrate the operation of this circuit. It is assumed that at a time t1, the semiconductor device 100 transitions from the active mode to the standby mode. When the internal voltage generation circuit 200 operates in the active mode, the power is supplied from the external power supply voltage VCC, the first voltage DIVA and the second voltage DIVB are greater than the reference voltage VREF, and the comparison results of the comparator CMP1 and the comparator CMP2 are at the H level. At this time, the logic 210 may also start to operate in response to the STBY representing the standby mode. That is, regardless of the comparison results of the comparator CMP1 and the comparator CMP2, the logic 210 enables the switch control signal VDDEN to be transferred to the H level, and sets the transistor Q to be not turned on. As a result, the power supply of the external power supply voltage VCC is blocked, and the voltage of the voltage supply node INTVDD gradually decreases.

At a time t2, when the first voltage DIVA and the second voltage DIVB become less than the reference voltage VREF, the logic 210 enables the switch control signal VDDEN to be transferred to the L level, and sets the transistor P1 to be turned on. As a result, the power is supplied from the external power supply voltage VCC, and the voltage of the voltage supply node INTVDD rises. At a time t3, when the first voltage DIVA and the second voltage DIVB become greater than the reference voltage VREF, the logic 210 enables the switch control signal VDDEN to be transferred to the H level, and sets the transistor Q to be not turned on. The logic 210 generates the clock signal DPDCLK that enables the switch control signal VDDEN to be inverted. At this time, the clock is counted by the counter 220.

After that, the same operation is repeated. When the logic 230 detects that the count value of the counter 220 for the clock of the clock signal DPDCLK is consistent with the predetermined number of times, the DPD enable signal DPDEN for blocking the power supply is generated and supplied to a specific internal circuit. The specific internal circuit blocks the power supply of the external power supply voltage VCC or the internal voltage VDD in response to the DPD enable signal DPDEN.

In this way, according to this embodiment, it is possible to automatically transition from the standby mode to the DPD mode without inputting an external command for transitioning to the DPD mode. Therefore, even a semiconductor device that does not support the command for transitioning to the DPD mode can use the DPD mode. In addition, the user convenience is improved.

In the embodiment, the pulse width of the clock signal DPDCLK is determined according to the RC time constant. Generally, the resistance of the resistance ladder LAD is specified according to current consumption requirements in the standby mode, and the load capacitance of the voltage supply node INTVDD is specified based on the size or stability of a load. Therefore, there is no flexibility for controlling the pulse width of the clock signal DPDCLK.

Figure 6:
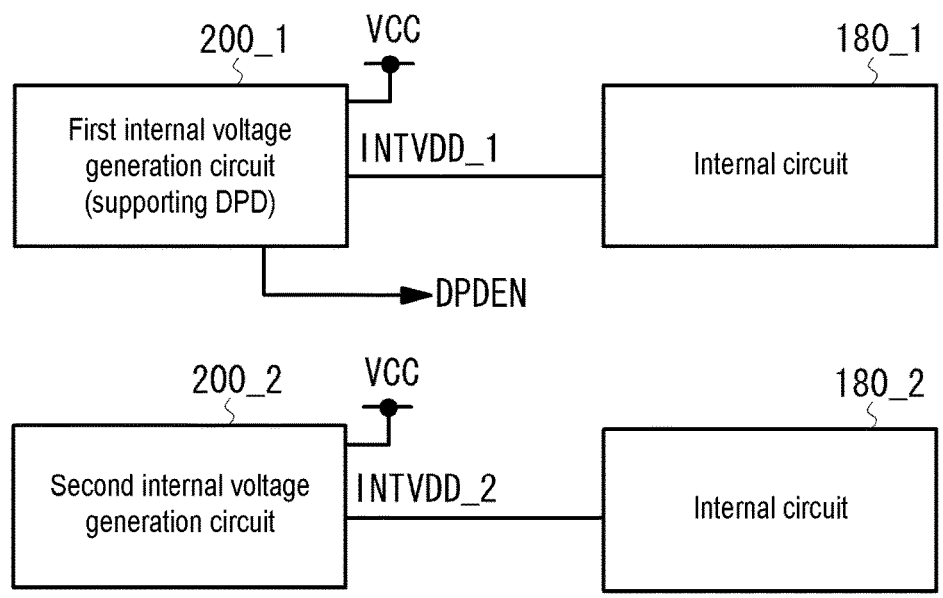
FIG. 6 is a diagram showing another configuration of the internal voltage generation circuit according to an embodiment of the disclosure.

Therefore, as shown in FIG. 6, a modification of this embodiment includes two separate first internal voltage generation circuit 200_1 and second internal voltage generation circuit 200_2. The first internal voltage generation circuit 200_1 supplies an internal voltage VDD1 to a first internal circuit 180_1 via a voltage supply node INTVDD_1. The second internal voltage generation circuit 200_2 supplies an internal voltage VDD2 to a second internal circuit 180_2 via a voltage supply node INTVDD_2.

The first internal voltage generation circuit 200_1 and the second internal voltage generation circuit 200_2 have the same configuration as the internal voltage generation circuit 200 shown in FIG. 4, but the first internal voltage generation circuit 200_1 has a DPD determination function, while the second internal voltage generation circuit 200_2 does not have the DPD determination function. The first internal voltage generation circuit 200_1 and the second internal voltage generation circuit 200_2 both operate in the standby mode. However, the first internal voltage generation circuit 200_1 is configured to adjust the RC time constant to be suitable for the pulse width required by the clock signal DPDCLK, and supply the internal voltage VDD1 generated by this RC time constant to the first internal circuit 180_1. On the other hand, the second internal voltage generation circuit 200_2 does not generate the clock signal DPDCLK, so the resistance of the resistance ladder LAD is specified to be suitable for the current consumption required in the standby mode, and there is no restriction on the load capacitance of the voltage supply node INTVDD_2.

In this way, according to this modification, the RC time constant of one internal voltage generation circuit among multiple internal voltage generation circuits operating in the standby mode is set to be suitable for the pulse width required by the clock signal DPDCLK, so that the time for transitioning to the DPD mode may be easily set. In addition, through increasing the RC time constant, the pulse width may be extended, thereby extending the operating period of the counter 220 to implement reduction in the power required for operating DPD determination.

In the embodiment, the internal voltage generation circuit generating the internal voltage VDD by the external power supply voltage VCC is exemplified, but not limited thereto. That is, the internal voltage generation circuit of this embodiment may also generate the second internal voltage VDD2 by the first internal voltage VDD1.

Figure 7:
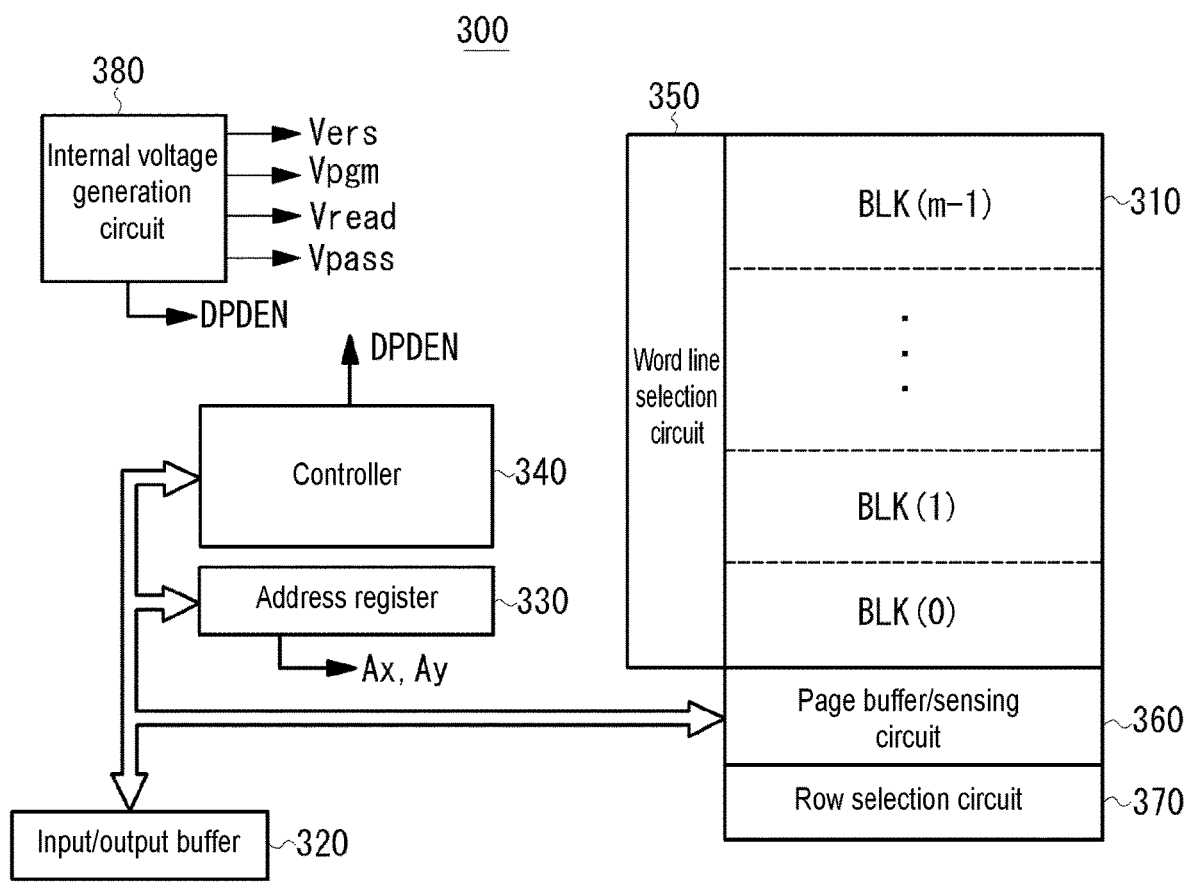
FIG. 7 is a diagram showing a configuration of a NAND type flash memory according to an embodiment of the disclosure.

Next, an example of a NAND type flash memory equipped with the automatic DPD mode of this embodiment is shown in FIG. 7. A flash memory 300 includes the following parts: a storage cell array 310, formed by multiple storage cells arranged in a matrix; an input/output buffer 320, connected to an external input/output terminal I/O; an address register 330, receiving address data from the input/output buffer 320; a controller 340, receiving command data, etc. from the input/output buffer 320 and controlling each part; a word line selection circuit 350, receiving column address information Ax from the address register 330, decoding the column address information Ax, and performing block selection, word line selection, etc. based on a decoding result; a page buffer/sensing circuit 360, holding data read from a page selected by the word line selection circuit 350, or holding input data that should be programmed to the selected page; a row selection circuit 370, receiving row address information Ay from the address register 330, decoding the row address information Ay, and selecting row address data in the page buffer/sensing circuit 360 based on the decoding result; and an internal voltage generation circuit 380, generating various voltages (a write voltage Vpgm, a pass voltage Vpass, a read pass voltage Vread, an erase voltage Vers, etc.) required for data reading, programming, erasing, etc.

In an embodiment, the flash memory 300 may output a busy signal/ready signal for informing an internal operating state (program, erase, read, etc.) from an external terminal. The controller 340 transitions to the standby mode in response to the output of the busy signal/ready signal. As described in the embodiment, the time since the time point of entering the standby mode is measured. When the measurement time reaches a certain time, the DPD enable signal DPDEN is generated and supplied to an internal peripheral circuit. The peripheral circuit receiving the DPD enable signal DPDEN blocks the power supply.

In addition, in another embodiment, the internal voltage generation circuit 380 includes the internal voltage generation circuit 200 shown in FIG. 4 or FIG. 6. In response to the busy signal/ready signal, the time since the time point of entering the standby mode is measured. When the measurement time reaches a certain time, the DPD enable signal DPDEN is generated and supplied to the internal peripheral circuit.

The embodiments of the disclosure have been described in detail, but the disclosure is not limited to specific embodiments. Various modifications and changes may be made within the scope of the spirit of the disclosure described in the claims.

What is claimed is:

1. A semiconductor device, comprising:
a semiconductor integrated circuit, operating in response to an external input signal;
a measurement part, measuring a time since a time point of the semiconductor device entering a standby mode;
a detection part, detecting a case where a measurement time of the measurement part has reached a certain time; and
a generation part, generating a power down enable signal for further reducing power consumption in the standby mode when the detection part detects the certain time.

2. The semiconductor device according to claim 1, wherein
the power down enable signal is supplied to a specific circuit in the semiconductor integrated circuit, and power supply to the specific circuit is blocked in response to the power down enable signal.

3. The semiconductor device according to claim 1, wherein
the semiconductor integrated circuit comprises a plurality of voltage generation circuits generating a second supply voltage based on a first supply voltage, and
the plurality of voltage generation circuits operate in the standby mode, and a voltage generation circuit among the plurality of voltage generation circuits comprises the measurement part, the detection part, and the generation part.

4. The semiconductor device according to claim 1, wherein
the semiconductor integrated circuit comprises a first voltage generation circuit operating in a non-standby mode and a second voltage generation circuit operating in the standby mode, and
the second voltage generation circuit comprises the measurement part, the detection part, and the generation part.

5. The semiconductor device according to claim 3, wherein
the voltage generation circuit comprises:
a first node, supplying the first supply voltage;
a second node, supplying the second supply voltage to a load;
a connection circuit, connected between the first node and the second node, and connecting or disconnecting the first node and the second node in response to a control signal;
a resistance ladder, connected between the second node and a reference potential;
a clock generation circuit, generating a clock signal based on a resistor-capacitor time constant generated between the second node and the reference potential when the first node and the second node are disconnected;
a first logic circuit, generating the control signal based on the clock signal;
a counter, counting a clock generated based on the clock signal; and
a second logic circuit, generating the power down enable signal based on a count value of the counter.

6. The semiconductor device according to claim 4, wherein
a resistance of a resistance ladder of the second voltage generation circuit is greater than a resistance of a resistance ladder of the first voltage generation circuit.

7. The semiconductor device according to claim 5, wherein
the clock generation circuit comprises a first comparator and a second comparator, and generates the clock signal based on comparison results of the first comparator and the second comparator, the first comparator compares a first voltage generated by the resistance ladder with a reference voltage, and the second comparator compares a second voltage less than the first voltage generated by the resistance ladder with the reference voltage.

8. The semiconductor device according to claim 5, wherein
the connection circuit comprises a p-channel metal oxide semiconductor transistor whose gate is applied with the control signal, and
the first logic circuit enables the control signal to be transferred to a low level when a time specified by the resistor-capacitor time constant has elapsed.

9. The semiconductor device according to claim 1, wherein
the semiconductor integrated circuit comprises a circuit related to a flash memory.

10. The semiconductor device according to claim 9, wherein
the semiconductor integrated circuit transitions to the standby mode in response to a busy signal or a ready signal.

* * * * *